United States Patent
Kobayashi et al.

(10) Patent No.: US 6,928,720 B2
(45) Date of Patent: Aug. 16, 2005

(54) METHOD OF MANUFACTURING A SURFACE ACOUSTIC WAVE DEVICE

(75) Inventors: Masato Kobayashi, Machida (JP); Masatoshi Nakagawa, Kyoto (JP); Makoto Tose, Moriyama (JP); Toshio Hagi, Kusatsu (JP); Toshimaro Yoneda, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 111 days.

(21) Appl. No.: 10/207,082

(22) Filed: Jul. 30, 2002

(65) Prior Publication Data

US 2002/0195905 A1 Dec. 26, 2002

Related U.S. Application Data

(62) Division of application No. 09/575,070, filed on May 19, 2000, now Pat. No. 6,483,224.

(30) Foreign Application Priority Data

May 27, 1999 (JP) ............................................ 11-147920

(51) Int. Cl.[7] ............................................. H04R 31/00
(52) U.S. Cl. ........................ 29/594; 29/592.1; 29/609.1; 181/171; 181/172; 204/192.15; 381/173; 381/174; 381/175; 367/140; 367/141; 367/170; 367/171; 367/181
(58) Field of Search ............................. 29/592.1, 594, 29/609.1; 204/192.15; 181/171, 172; 367/170, 171, 181, 140, 141; 381/173–175, 396, 398; 310/313, 320, 360

(56) References Cited

U.S. PATENT DOCUMENTS

| | | | | |
|---|---|---|---|---|
| 4,340,834 A | | 7/1982 | Sato | |
| 5,221,449 A | | 6/1993 | Colgan | |
| 5,281,485 A | * | 1/1994 | Colgan et al. | ............... 428/457 |
| 5,847,486 A | | 12/1998 | Kadota et al. | |
| 5,850,167 A | * | 12/1998 | Abe | ........................... 333/194 |
| 6,088,462 A | * | 7/2000 | Fujimoto et al. | ............ 381/160 |
| 6,144,057 A | * | 11/2000 | Yamazaki | .................... 257/306 |
| 6,154,105 A | * | 11/2000 | Fujimoto et al. | ............ 333/194 |
| 6,191,031 B1 | * | 2/2001 | Taguchi et al. | .............. 438/642 |

FOREIGN PATENT DOCUMENTS

| | | | | |
|---|---|---|---|---|
| JP | 61-45892 | | 10/1986 | |
| JP | 63-185052 A | | 7/1988 | |
| JP | 02251823 A | * | 10/1990 | ............ G02F/1/136 |
| JP | 04186815 A | * | 7/1992 | ............ H01L/21/02 |
| JP | 8-019516 | | 2/1996 | |
| JP | 10-247835 | | 9/1998 | |

OTHER PUBLICATIONS

"Control of second order temperature coefficient of SAW propagating in two thin film layers"; Nakagawa, Y.; Ultrasonics Symposium, 1983. Proceedings., IEEE 1993, Oct. 31–Nov. 3, 1993 pp.: 287–290.*

* cited by examiner

Primary Examiner—Paul D Kim
(74) Attorney, Agent, or Firm—Keating & Bennett, LLP

(57) ABSTRACT

A surface acoustic wave device includes a piezoelectric substrate and at least one interdigital electrode disposed on the piezoelectric substrate. The interdigital electrode is made of α-tantalum.

9 Claims, 8 Drawing Sheets

METHOD OF MANUFACTURING A SURFACE ACOUSTIC WAVE DEVICE

This application is a Divisional of U.S. patent application Ser. No. 09/575,070 filed May 19, 2000, now U.S. Pat. No. 6,483,224.

BACKGROUND OF THE INVENTION

1. Field of the Invention

The present invention relates to a surface acoustic wave device for use as a band-pass filter, and a resonator, for example, and a method of producing the same, and more particularly, to a surface acoustic wave device which includes an interdigital electrode made of tantalum, and a method of producing the same.

2. Description of the Related Art

Conventionally, surface acoustic wave devices have been widely used as band-pass filters and resonators. For surface acoustic wave devices for such uses, very good high frequency characteristics are critical for desired operation.

Further, cost-reduction is urgently required for the surface acoustic wave devices, as well as other electronic components.

In the surface acoustic wave device disclosed in Japanese Examined Patent Publication No. 61-45892, an interdigital electrode made of gold is disposed on a X-rotated, Y-cut quartz substrate in such a manner that the X axis and the surface acoustic wave propagation direction define an angle of about 90°.

Further, Japanese Unexamined Patent Application Publication No. 10-247835(Japanese Patent Application No. 9-61731) discloses a surface acoustic wave device provided with an interdigital electrode with a two-layer structure which contains an aluminum layer as an underlying layer and a tantalum layer laminated to the aluminum layer.

In the case where a narrow-band-pass filter includes a surface acoustic wave device, it is desired that unevenness in the center frequency of a surface acoustic wave device is minimized. Accordingly, for production of a surface acoustic wave device for use as a narrow-band-pass filter, it has been conventionally required to finely adjust the frequency of the surface acoustic wave device after the production process is completed.

A typical method of finely adjusting the frequency as described above is such that the fine adjustment of frequency is carried out by dry-etching an interdigital electrode with plasma using $CF_2+O_2$ (Appl. Phys. Lett, 39(1), p.40 (July, 1981)).

For example, in production of a surface acoustic wave device including a quartz substrate, ordinarily, the shift of the center frequency is about 300 ppm. According to the above-described fine adjustment method, the frequency can be changed by a maximum of about 500 ppm. It is estimated that finally, the shift of the center frequency can be suppressed to be within 50 ppm.

Generally, the operation frequency of a surface acoustic wave device is determined by $f=v/\lambda$ (v=propagation velocity of surface acoustic wave, $\lambda$=wavelength of surface acoustic wave). The wavelength $\lambda$ depends on the configuration of an interdigital electrode. Ordinarily, the interdigital electrode is formed by a fine processing technique using photolithography. Generally, the above-mentioned fine-processing is performed by a combination of a thin-film forming technique such as a chemical deposition method, e.g., vapor deposition, CVD, or other suitable method, and a physical deposition method, e.g., sputtering, with an etching process or other suitable method, and further by repeating these techniques, if necessary.

When gold is used as a material for forming an interdigital electrode as in the surface acoustic wave device described in Japanese Examined Patent Publication 61-45892, the gold is formed into a film by a chemical deposition method in general. However, when an electrode made of gold is formed on a piezoelectric substrate by chemical deposition, there arises the problem that the adhesion of the electrode made of gold to the piezoelectric substrate is insufficient. Accordingly, for improving the strength of adhesion between the interdigital electrode and the piezoelectric substrate, it is necessary to form an electrode layer of chromium or other suitable material as the underlying layer for the electrode of gold. Thus, this greatly complicates the production process. Moreover, gold is expensive, which increases the material cost, and also, the cost of the surface acoustic wave device.

On the other hand, as disclosed in Japanese Unexamined Patent Application Publication No. 8-125485, it has been proposed that tantalum is used as an interdigital electrode material. Ordinarily, tantalum is film-formed by a physical deposition method such as sputtering, since tantalum is a metal having a high melting point. However, the crystal structure of a tantalum film formed by such a method is that of β-tantalum, and the resistivity is relatively high, that is, 180 $\mu\Omega$·cm. Accordingly, the characteristics of the surface acoustic wave device, especially the insertion loss, tend to be deteriorated, since the electric resistance of the electrode is increased.

Accordingly, as disclosed in Japanese Unexamined Patent Application Publication No. 10-247835, a method of forming an aluminum layer with high conductive properties as an underlying layer for the electrode layer made of tantalum has been proposed. However, for formation of the interdigital electrode, it is necessary that plural metal layers are laminated. This causes the production process to be complicated and expensive.

As described above, it is difficult to adjust the shift of a frequency by at least 500 ppm in the method of finely adjusting the frequency of a surface acoustic wave device by dry-etching utilizing plasma. This is because the plasma damages a piezoelectric body, resulting in deterioration of the insertion loss of the surface acoustic wave device.

Moreover, in order to perform the above-described fine adjustment of frequency, it is necessary that the fine adjustment of frequency is conducted for every substrate. Accordingly, there is the problem that the yield ratio is reduced when the film-thickness distribution of the interdigital electrode is uneven.

SUMMARY OF THE INVENTION

To overcome the problems described above, preferred embodiments of the present invention provide a surface acoustic wave device having an interdigital electrode made of tantalum in which the adhesion of the interdigital electrode to the piezoelectric substrate is high, the cost of the interdigital electrode is greatly reduced, the process of forming the interdigital electrode is simplified, and the insertion loss is greatly improved, and a method of producing the same.

In the surface acoustic wave device of one preferred embodiment of the present invention, the interdigital electrode on the piezoelectric substrate preferably includes α-tantalum. As a result of this structure, the resistivity of the interdigital electrode is greatly reduced, and also, the insertion loss of the surface acoustic wave device is greatly improved.

The α-tantalum film has a high strength of adhesion to the piezoelectric substrate. Accordingly, deterioration of the characteristics of the surface acoustic wave device in the ambience of high temperature and humidity is minimized.

Moreover, the characteristics of the surface acoustic wave device can be easily adjusted by controlling the film thickness of the α-tantalum film. Thus, since the frequency adjustment can be made by controlling the film-thickness of the α-tantalum film in addition to conventional dry etching for fine adjustment of frequency, the frequency adjustment range can be scaled up. Moreover, the interdigital electrode can be formed so as to be comprised of only an α-tantalum film. Accordingly, the electrode forming process for the IDT electrode is greatly simplified and much less expensive and time consuming.

According to preferred embodiments of the present invention, a surface acoustic wave device which can be easily produced, is inexpensive, has a wide frequency adjustment range, and of which the reduction of the insertion loss is inhibited, and deterioration of the characteristics in the high temperature and humidity is minimized, and the reliability is high.

According to preferred embodiments of the present invention, the insertion loss can be reduced when the resistivity of the interdigital electrode is at about 25° C. of up to 150 μΩ·cm. Thus, a surface acoustic wave device having excellent characteristics is achieved.

According to a method of producing a surface acoustic wave device of preferred embodiments of the present invention, sputtering is carried out by use of an inert gas containing nitrogen and a target of tantalum, whereby at least one interdigital electrode of tantalum is formed on a substrate. Accordingly, the surface acoustic wave device of preferred embodiments of the present invention are produced easily by using a piezoelectric substrate as the substrate.

When the distance between the substrate and the target of tantalum is at least about 20 cm for sputtering, the film-thickness of the α-tantalum film can be made uniform. Thus, a surface acoustic wave device having further improved characteristics can be provided.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWINGS

FIG. 8 is a graph showing the relation of the thicknesses of the α-tantalum films and the electromechanical coefficients $k^2$, determined based on the relation of the film-thicknesses of the α-tantalum films to the sound velocities shown in FIG. 7.

DETAILED DESCRIPTION OF PREFERRED EMBODIMENTS

Hereinafter, preferred embodiments of the present invention are explained in detail with reference to the drawings.

The features and advantages of preferred embodiments present invention will be apparent from the following description of specific examples of preferred embodiments of the surface acoustic wave device of the present invention, with reference to the drawings.

Figure 1:
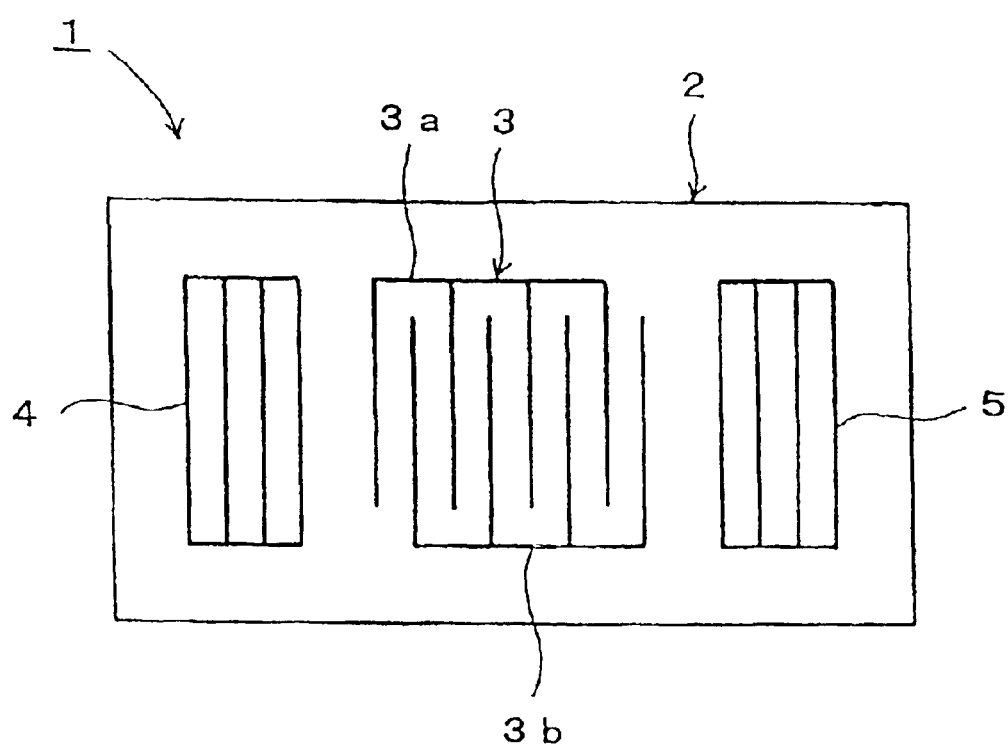
FIG. 1 is a schematic plan view showing a surface acoustic wave device according to a preferred embodiment of the present invention.

FIG. 1 is a schematic plan view of a surface acoustic wave device according to a preferred embodiment of the present invention.

In a surface acoustic wave device 1, an interdigital electrode (hereinafter, IDT electrode) 3 is disposed on a piezoelectric substrate 2. The IDT electrode 3 has a pair of interdigital electrodes 3a and 3b which include electrode fingers that are interdigitated with each other. The electrode fingers of the IDT electrode 3 are arranged to elongate perpendicularly relative to the surface acoustic wave propagation direction. Further, reflectors 4 and 5 are located on both-sides in the surface acoustic wave propagation direction of the IDT electrode 3. The reflectors 4 and 5 are preferably grating type reflectors each having the structure in which plural fingers are short-circuited at the both-ends thereof.

In this preferred embodiment, one pair of the reflectors 4 and 5 are disposed on both-sides of one IDT electrode 3 as described above. The electrode configuration of the surface acoustic wave device of the present invention is not limited to the above-described configuration. That is, plural IDT electrodes may be arranged in the surface acoustic wave propagation direction. Further, the reflectors 4 and 5 can be omitted. For example, in the case where an end surface reflection type surface acoustic wave device utilizing an SH type surface acoustic wave is formed, a surface acoustic wave is made to reflect from the opposite end surfaces of the piezoelectric substrate. Therefore, the reflectors may be omitted.

In the present preferred embodiment, one terminal pair SAW resonator having one IDT electrode 3 is formed. Plural IDT electrodes are also provided to produce a band-pass filter.

The piezoelectric substrate 1 preferably has a substantially rectangular plate shape, and may be formed of a piezoelectric single crystal substrate of quartz, $LiTaO_3$, $LiNbO_3$, or other suitable material, or a piezoelectric ceramic substrate of a lead titanate zirconate type ceramic or other suitable material.

However, it is not necessary for the entire piezoelectric substrate 1 to be formed completely of piezoelectric material. For example, the piezoelectric substrate 1 may include a piezoelectric thin film such as a ZnO thin film formed on a substrate with insulation properties, or may include a piezoelectric thin film laminated on a piezoelectric substrate made of a piezoelectric material. In the case where the piezoelectric thin film is laminated on the insulation substrate or the piezoelectric substrate, electrodes such as the IDT electrode 3 and the reflectors 4 and 5 may be disposed on the upper side or the underside of the piezoelectric thin film.

One of the characteristics of the surface acoustic wave device 1 of the present preferred embodiment is that at least a portion of the above-described IDT electrode 3 and the reflectors 4 and 5 is made of α-tantalum. As a result, the reduction in resistivity of the IDT electrode 3, and also, the improvement of the insertion loss are achieved realized. In addition, the strength of adhesion of the IDT electrode 3 to the piezoelectric substrate 1 is greatly improved. This will be described based on the experimental example.

Ordinarily, in the case where tantalum is formed on a piezoelectric substrate by sputtering, a β-tantalum film is formed. On the other hand, an α-tantalum film can be formed by sputtering using an inert gas containing nitrogen as a sputtering gas and a target made of tantalum, as in various preferred embodiments of the present invention.

For example, the sputtering conditions under which an α-tantalum film is formed may be as follows:

(1) target: tantalum
(2) sputtering gas: argon gas containing nitrogen
(3) gas pressure in a sputtering film forming chamber: 0.23 Pa
(4) sputtering power: 4 kV
(5) substrate temperature: room temperature to 250° C.

Further, as the sputtering gas, helium, neon, krypton, xenon or other suitable gas may be used instead of argon. An α-tantalum film can be formed by incorporating nitrogen into these inert gases.

Figure 2:
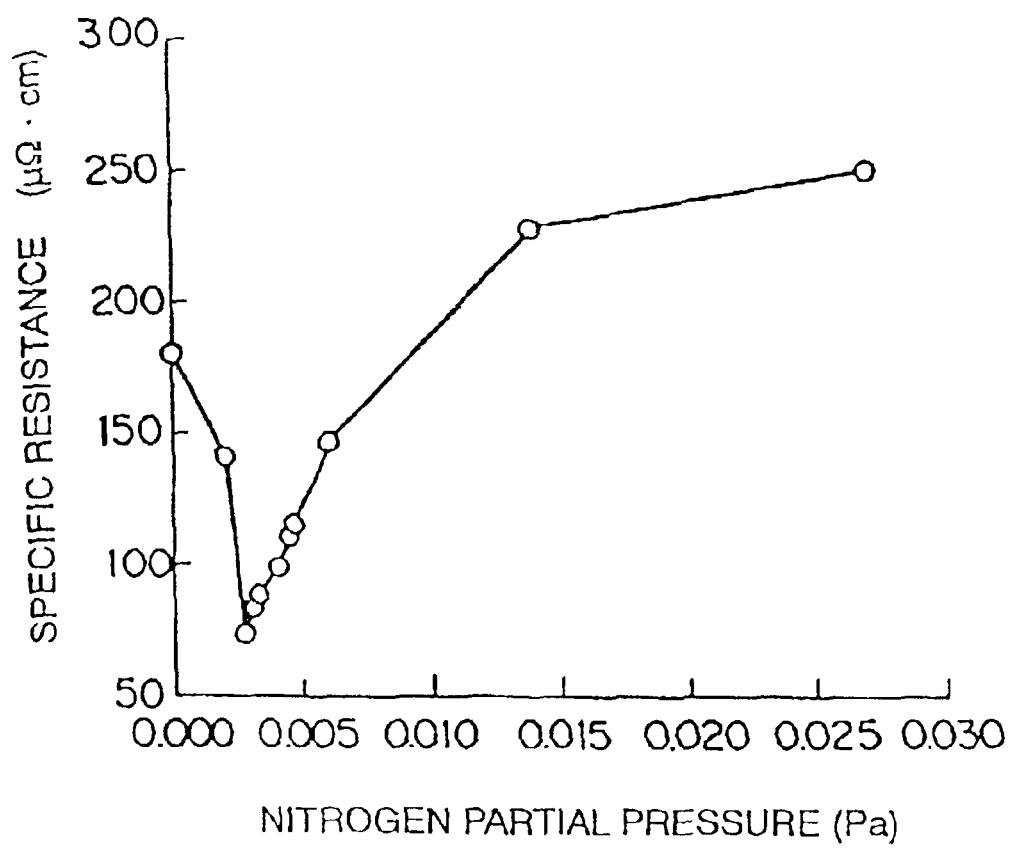
FIG. 2 is a graph showing the relationship between the nitrogen partial pressure of nitrogen gas incorporated into an inert gas for sputtering and the specific resistance of a formed α-tantalum film.

FIG. 2 shows changes in resistivity of the tantalum films formed on a quartz substrate, at a substrate temperature of about 100° C., a gas pressure in the film-forming chamber of about 0.23 Pa, a sputtering power of about 3 kW, and different partial pressures of nitrogen in a sputtering gas.

As seen in FIG. 2, in the case where nitrogen is incorporated into the sputtering gas and the nitrogen partial pressure is in the range of about 0.001 Pa to about 0.007 Pa, a tantalum film with a specific resistance of up to about 150 $\mu\Omega\cdot$cm can be obtained.

Figure 3:
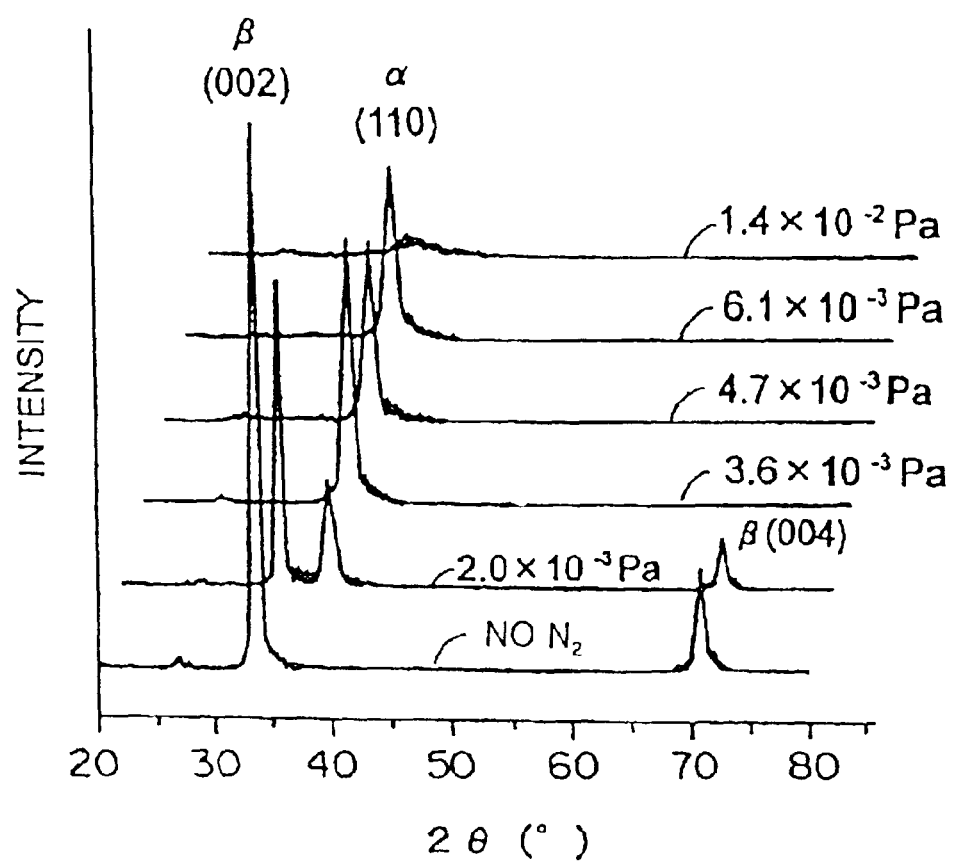
FIG. 3 is a graph showing the XRD spectral data of the crystallinities of tantalum films obtained when nitrogen gas is incorporated into an inert gas at different ratios.

FIG. 3 shows the XRD spectra of the tantalum films obtained at the different nitrogen partial pressures as described above. In FIG. 3, the peak (110) represents α-tantalum, and the peak appended by (002) represents β-tantalum. In FIG. 3, it is seen that in the case where no nitrogen gas is incorporated into the sputtering gas, a β-tantalum film is formed, while an α-tantalum film can be formed by introducing a nitrogen gas.

That is, as seen in FIGS. 2 and 3, tantalum films having a specific resistance of up to about 150 $\mu\Omega\cdot$cm are formed under the condition that a nitrogen gas is introduced into the sputtering gas and the nitrogen partial pressure is about 0.001 Pa to about 0.007 Pa. It is understood that the tantalum film having such a low resistivity is an α-tantalum film.

In the surface acoustic wave device 1 of the above preferred embodiment, since the IDT electrode 3 is formed of α-tantalum, and therefore, the resistivity of the IDT electrode 3 is reduced to about 150 $\mu\Omega\cdot$cm or lower. Accordingly, it is understood that the insertion loss is greatly improved.

The IDT electrode 3 and the reflectors 4 and 5 each including an α-tantalum film were formed on a quartz substrate as the piezoelectric substrate, as described above, to produce the surface acoustic wave device 1, whereby a surface acoustic wave device 1 was obtained. Regarding the surface acoustic wave device 1, the high temperature standing humidity test was carried out, and the adhesion strength of the IDT electrode 3 was evaluated. In this case, the thickness of the IDT electrode 3 was about 380 nm, the number of pairs of the electrode fingers was 15, the width of the electrode fingers was about 7 $\mu$m, and the pitch between electrode fingers was about 10 $\mu$m.

With regard to the high temperature standing humidity test, the surface acoustic wave device 1 was left to stand for 100 hours in an environment of about 85° C. and a relative humidity of about 85%. The resistance of the surface acoustic wave device was measured at predetermined time intervals, and the change ratio of the resistance based on that before the high temperature standing humidity test was carried out was determined.

With regard to the adhesion strength test, the α-tantalum film formed on the quartz substrate was evaluated by means of a thin film scratching testing machine Model CSR-02 manufactured by RHESCA.

Figure 4:
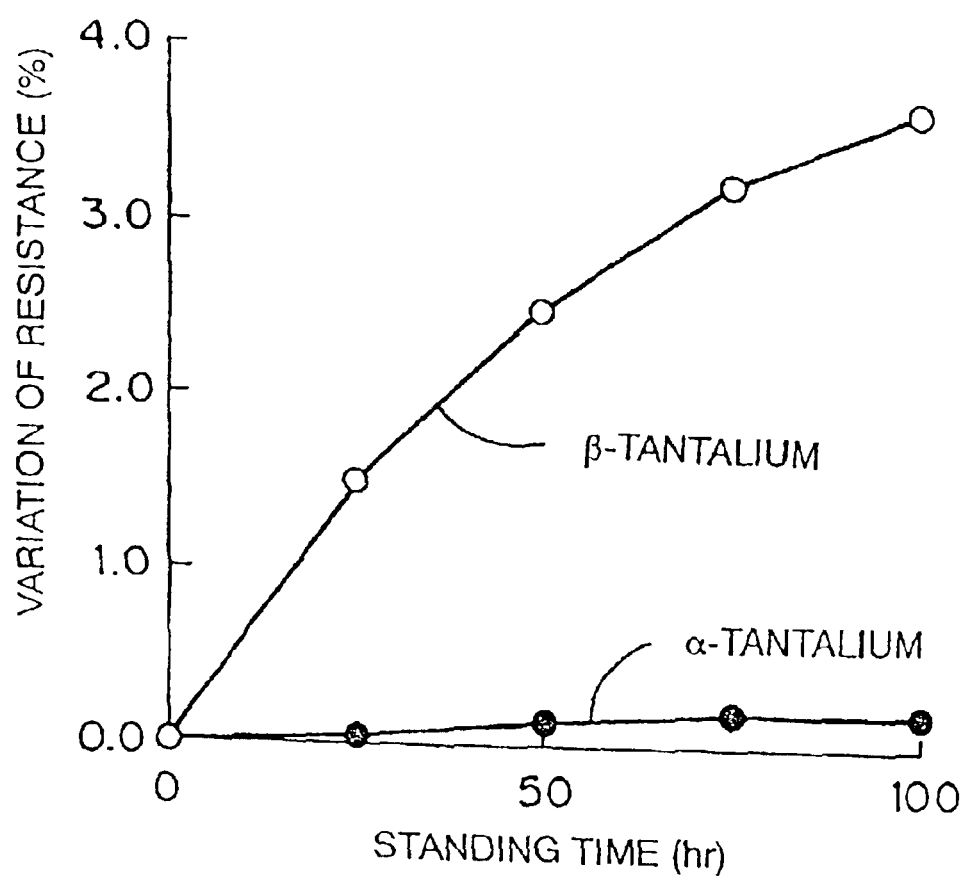
FIG. 4 is a graph showing the high temperature standing humidity test results of a surface acoustic wave device according to a preferred embodiment using an α-tantalum film, and those of a surface acoustic wave device formed by use of a β-tantalum film, prepared for comparison.
Figure 5:
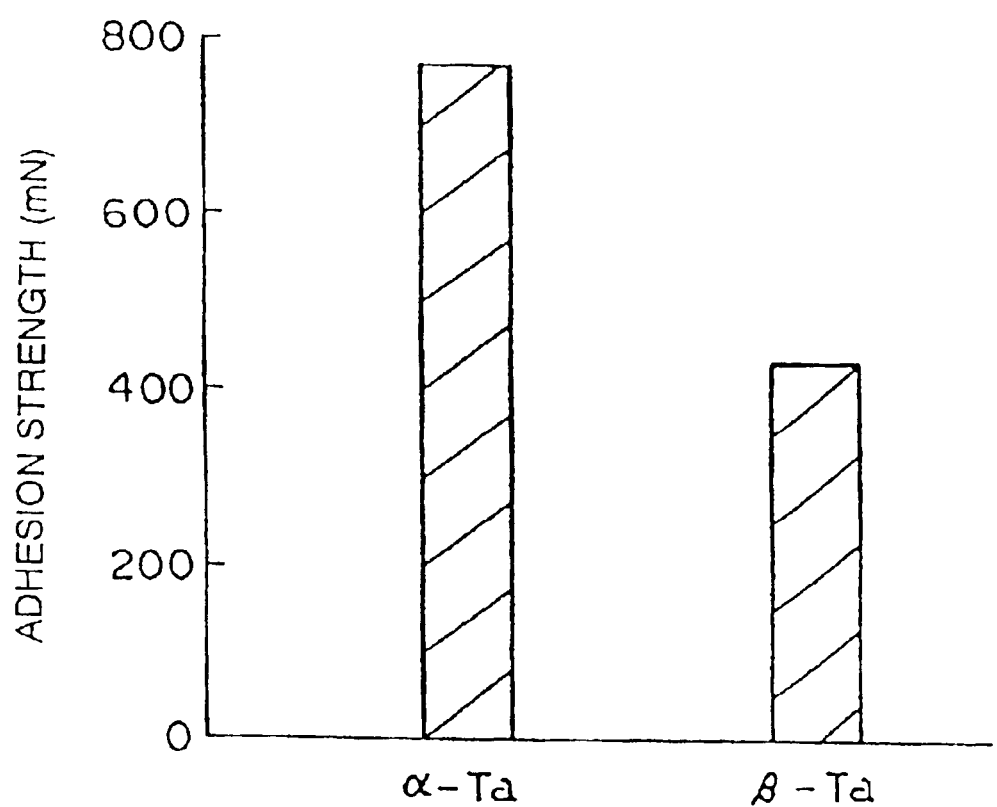
FIG. 5 is a graph showing the adhesion strength of the α-tantalum film to the substrate in a surface acoustic wave device of a preferred embodiment and that of a β-tantalum film, prepared for comparison, to the piezoelectric substrate.

FIGS. 4 and 5 show the results.

For comparison, a surface acoustic wave device having an IDT electrode 3 was prepared in the same manner as described above except that the IDT electrode 3 was formed of a β-tantalum film. The high temperature standing humidity test and the adhesion strength test were carried out. FIGS. 4 and 5 show the results.

As seen in FIGS. 4 and 5, in the high temperature standing humidity test and the adhesion strength test, the surface acoustic wave device of the present preferred embodiment having the IDT electrode 3 made of an α-tantalum film achieved results superior to those of the surface acoustic wave device having the IDT electrode made of a β-tantalum film prepared for comparison. The superior results are obtained in the high temperature standing humidity test, as shown in FIG. 5, since the adhesion strength of the α-tantalum film to the substrate is high.

Accordingly, the resistivity is not only greatly reduced, thereby achieved improvement of the insertion loss, but also the strength of adhesion of the IDT electrode 3 to the piezoelectric substrate is effectively increased by forming the IDT electrode 3 made of an α-tantalum film.

Figure 6:
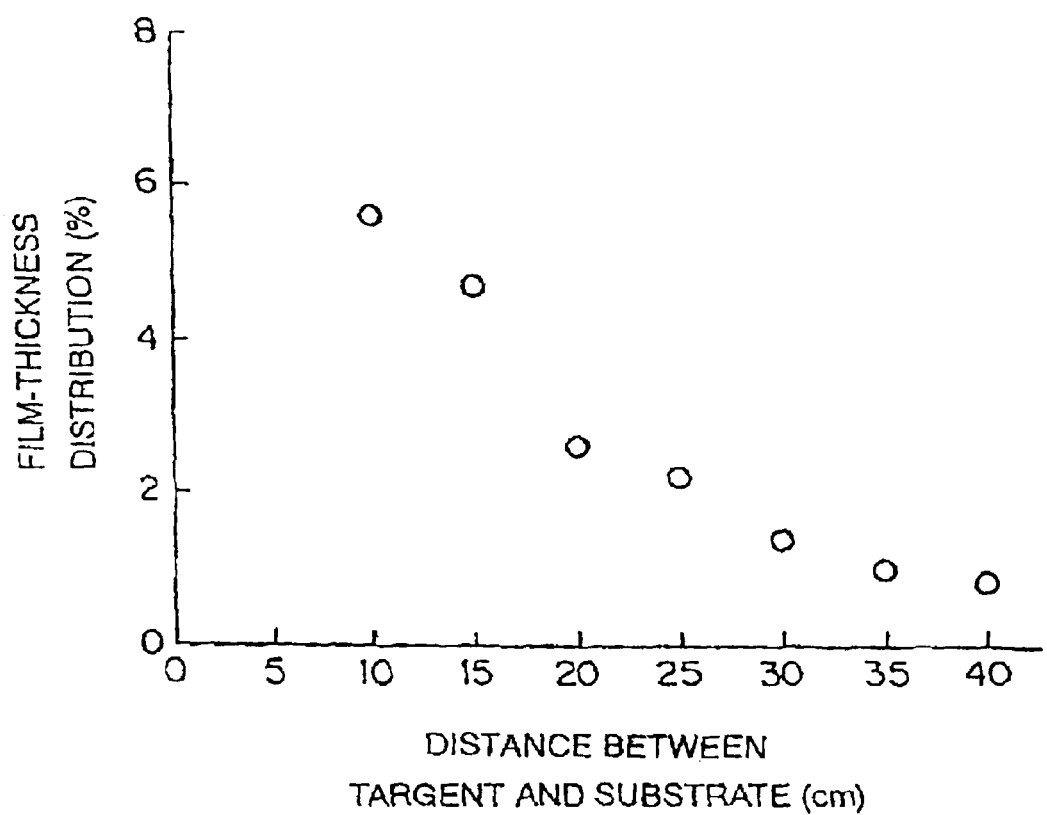
FIG. 6 is a graph showing the relation of the distance between a target and a piezoelectric substrate, set for sputtering, to the film-thickness distribution of a formed α-tantalum film.

Further, with regard to the formation of the above-described α-tantalum film on the piezoelectric substrate, the relationship between the distance of the target from the piezoelectric substrate and the film thickness distribution of the α-tantalum film was investigated. FIG. 6 shows the results.

The results of FIG. 6 were obtained under the condition that the substrate temperature was about 100° C., the sputtering gas pressure was about 0.10 Pa, the applied power was about 3 kW, argon and nitrogen were used as the sputtering gas, and the nitrogen partial pressure was about $3.6 \times 1^{-3}$ Pa.

As seen in FIG. 6, as the distance between the target and the piezoelectric substrate is larger, the film thickness distribution of the formed α-tantalum film becomes smaller. The film thickness distribution is defined as a value expressed by film thickness distribution=(maximum α-tantalum film thickness−minimum)/(maximum α-tantalum film+minimum)×100%.

As seen in FIG. 6, as the distance between the target and the piezoelectric substrate is larger, the film thickness distribution of the α-tantalum film becomes smaller. Especially, it is seen that the film thickness distribution can be reduced to be about 3% or lower by setting the distance between the target and the piezoelectric substrate at about 20 cm or more. Thus, it is clear that the film thickness distribution of the IDT electrode is greatly improved. The upper limit of the distance between the target and the piezoelectric substrate is not especially defined from the standpoint of improvement of the film thickness distribution. Ordinarily, when the IDT electrode of the surface acoustic wave device is formed on a mother substrate, the upper limit is set at about 200 cm or less.

Next, the frequency adjustment of the surface acoustic wave device of this preferred embodiment will be described. As described previously, it is known that conventionally, the frequency of the surface acoustic wave device can be finely adjusted by dry-etching with plasma using a $CF_4+O_2$ gas after a surface acoustic wave device is formed. In the surface acoustic wave device of this preferred embodiment, the frequency can be finely adjusted by dry-etching under the following conditions.

| (1) etching gas | $CF_4 + O_2$ gas |
|---|---|
| (2) etching gas pressure | 2 Pa |
| (3) etching temperature | 60° C. |
| (4) etching power | 500 W |

The following dry etching conditions can be appropriately changed depending on the specific configuration of the surface acoustic wave device 1. In the surface acoustic wave device 1 of this preferred embodiment, the frequency can be finely adjusted by dry etching as described above.

Further, in the surface acoustic wave device of preferred embodiments of the present invention, the sound velocity and the electromechanical coefficient $k^2$ of the surface acoustic wave device can be finely adjusted by controlling the film thickness of the α-tantalum film. This will be described with reference to FIGS. 7 and 8.

Figure 7:
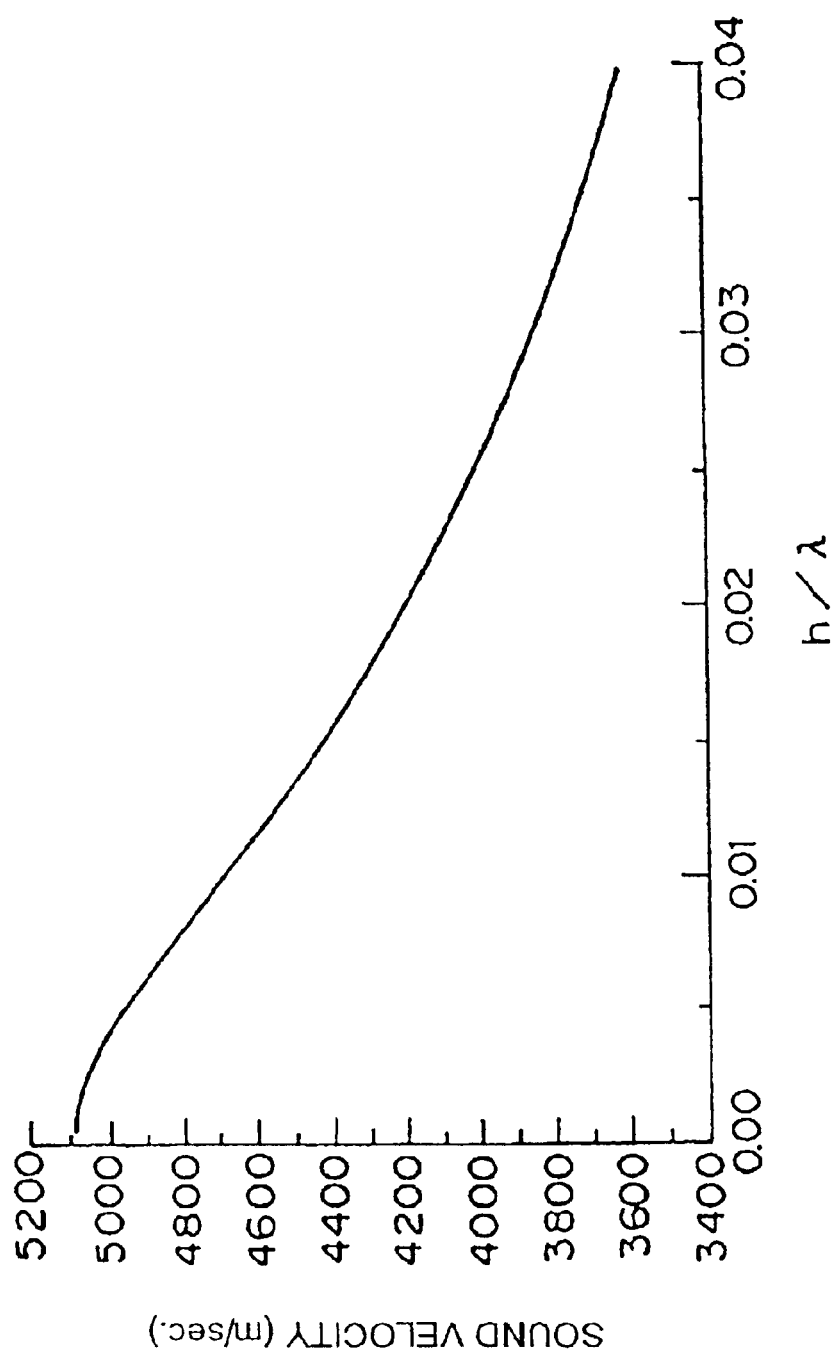
FIG. 7 is a graph showing changes in sound velocity of a surface acoustic wave occurring when α-tantalum films having different thicknesses are formed on a quartz substrate with Euler's angles (0, 127, 90).
Figure 1:
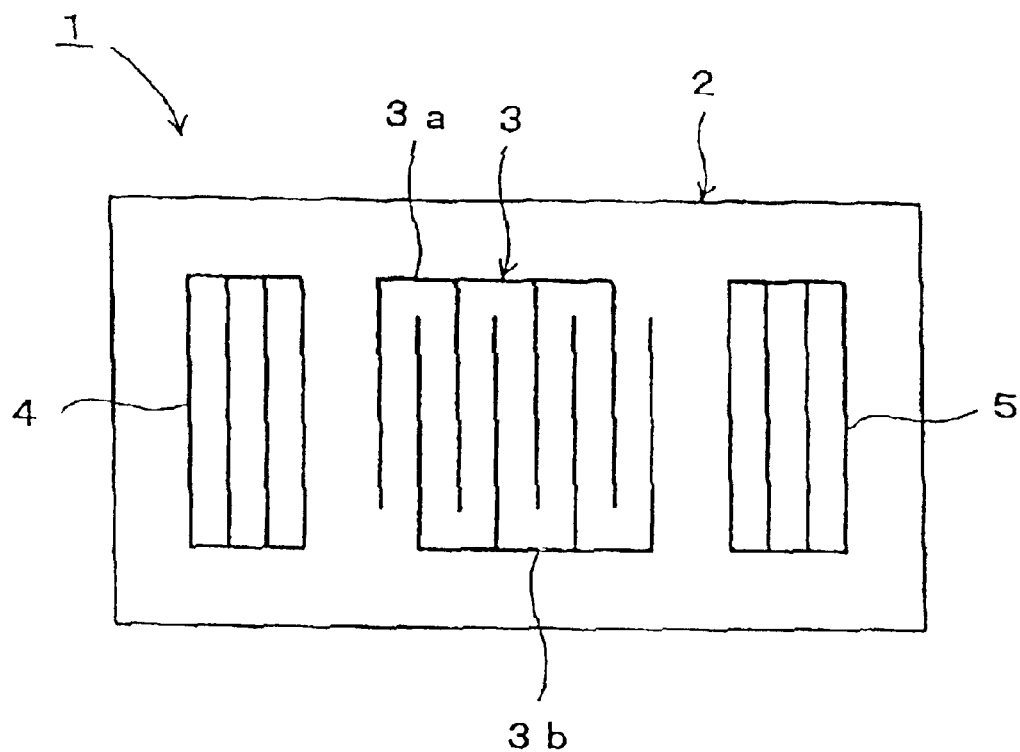

FIG. 7 shows changes in sound velocity of a surface acoustic wave obtained when a quartz rotation Y plate with Euler's angles (0, 127, 90) is used, and a α-tantalum film is formed on the piezoelectric substrate with different film thicknesses. In FIG. 7, the normalized film-thickness h/λ of an α-tantalum film (h represent the film thickness of the tantalum film, and λ the wavelength of a surface acoustic wave) is plotted as the abscissa, and the sound velocity (m/s) of the surface acoustic wave is plotted as the ordinate.

As seen in FIG. 7, as the film thickness h/λ of the α-tantalum film is increased, the sound velocity of the surface acoustic wave is decreased.

Further, the relationship between film-thickness h/λ of each α-tantalum thin film and the electromechanical coefficient $k^2$ (%) was determined, based on the sound velocity of the surface acoustic wave. FIG. 8 shows the results. In FIG. 8, the electromechanical coefficient $k^2$ is defined as a value calculated by the following equation (1).

$$k^2=2\times(V_o-V_s)/V_o \quad (1)$$

$V_o$ represents the sound velocity of a surface acoustic wave when the dielectric constant of tantalum is 1, and $V_s$ the sound velocity of the surface acoustic wave when the dielectric constant of tantalum is 0.

As seen in FIGS. 7 and 8, in the surface acoustic wave device of preferred embodiments of the present invention, the sound velocity and the electromechanical coefficient can be also adjusted by changing the film thickness of the α-tantalum film. Thus, the frequency characteristic can be adjusted by controlling the film thickness in addition to the frequency adjustment by dry etching described above. Accordingly, it is possible that the frequency characteristic of the surface acoustic wave device can be adjusted in a wide range.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of manufacturing a surface acoustic wave device, comprising the steps of:

providing a substrate; and forming at least one interdigital electrode including only α-tantalum directly on the substrate.

2. The method according to claim 1, wherein the step of forming the at least one interdigital electrode includes sputtering using an inert gas containing nitrogen and a target made of tantalum.

3. The method according to claim 2, wherein for the sputtering, the distance between the substrate and the target made of the tantalum is in the range of from about 20 cm to about 200 cm.

4. The method according to claim 2, wherein the sputtering gas is argon gas, a gas pressure in a sputtering film forming chamber is about 0.23 Pa, a sputtering power is about 4 kV, and a substrate temperature is up to about 250° C.

5. The method according to claim 2, wherein the sputtering gas is a gas selected from the group consisting of argon gas, helium, neon, krypton and xenon.

6. The method according to claim 2, wherein the sputtering gas includes nitrogen and a gas selected from the group consisting of argon gas, helium, neon, krypton and xenon.

7. The method according to claim 1, wherein the step of forming the at least one interdigital electrode includes the step of forming a pair of reflectors on each side of the at least one interdigital electrode.

8. The method according to claim 7, wherein the step of forming the pair of reflectors includes the step of forming the reflectors to include α-tantalum.

9. The method according to claim 7, wherein the step of forming the pair of reflectors includes the step of forming the reflectors of only α-tantalum.

* * * * *